(12) United States Patent
Mauer

(10) Patent No.: US 12,278,630 B2
(45) Date of Patent: Apr. 15, 2025

(54) FAST FOURIER TRANSFORM (FFT) BASED DIGITAL SIGNAL PROCESSING (DSP) ENGINE

(71) Applicant: Intel Corporation, Santa Clara, CA (US)

(72) Inventor: Volker Mauer, Princes Risborough (GB)

(73) Assignee: Altera Corporation, San Jose, CA (US)

( * ) Notice: Subject to any disclaimer, the term of this patent is extended or adjusted under 35 U.S.C. 154(b) by 689 days.

(21) Appl. No.: 17/484,463

(22) Filed: Sep. 24, 2021

(65) Prior Publication Data

US 2022/0014199 A1 Jan. 13, 2022

(51) Int. Cl.
G06F 17/14 (2006.01)
H03K 19/0175 (2006.01)
H03K 19/17728 (2020.01)
H03K 19/17736 (2020.01)

(52) U.S. Cl.
CPC ..... *H03K 19/17728* (2013.01); *G06F 17/142* (2013.01); *H03K 19/017581* (2013.01); *H03K 19/1774* (2013.01)

(58) Field of Classification Search
CPC .......... G06F 17/142; H03K 19/017581; H03K 19/17728; H03K 19/1774
See application file for complete search history.

(56) References Cited

U.S. PATENT DOCUMENTS

| | | | | |
|---|---|---|---|---|
| 5,168,460 A | * | 12/1992 | Tower | G06F 17/142 708/407 |
| 8,510,362 B2 | * | 8/2013 | Moon | G06F 17/142 708/404 |
| 2008/0030385 A1 | * | 2/2008 | Huang | H04N 19/60 341/88 |
| 2009/0245092 A1 | * | 10/2009 | Sampath | H04L 27/2651 370/210 |
| 2017/0159813 A1 | * | 6/2017 | Kao | F16H 59/68 |

* cited by examiner

*Primary Examiner* — Kurtis R Bahr
(74) *Attorney, Agent, or Firm* — Fletcher Yoder, P.C.

(57) ABSTRACT

A digital signal processing (DSP) block includes a Fast Fourier Transform (FFT) unit capable of performing an FFT operation. The FFT unit includes a first FFT engine capable of converting a signal between a time-domain and a frequency-domain and the first FFT engine is a fixed size FFT engine. The FFT unit also includes a second FFT engine communicatively coupled to the first FFT engine and the second FFT engine is a variable size FFT engine. The FFT unit also includes a scale/offset block communicatively coupled to the second FFT engine and the scale/offset block is capable of performing a multiplication operation, an addition operation, or a combination thereof on an output of the second FFT engine.

20 Claims, 8 Drawing Sheets

FAST FOURIER TRANSFORM (FFT) BASED DIGITAL SIGNAL PROCESSING (DSP) ENGINE

BACKGROUND

The present disclosure relates generally to integrated circuit (IC) devices such as programmable logic devices (PLDs). More particularly, the present disclosure relates to a digital signal processing (DSP) block including Fast Fourier Transform engines that may be included on an integrated circuit device as well as applications that can be performed utilizing the processing block.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices may be utilized for a variety of purposes or applications, such as digital signal processing and machine learning. Indeed, machine learning and artificial intelligence applications have become ever more prevalent. Programmable logic devices may be utilized to perform these functions, for example, using particular circuitry (e.g., processing blocks). In some cases, particular circuitry that is effective for digital signal processing may not be well suited for machine learning, while particular circuitry for machine learning may not be well suited for digital signal processing.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
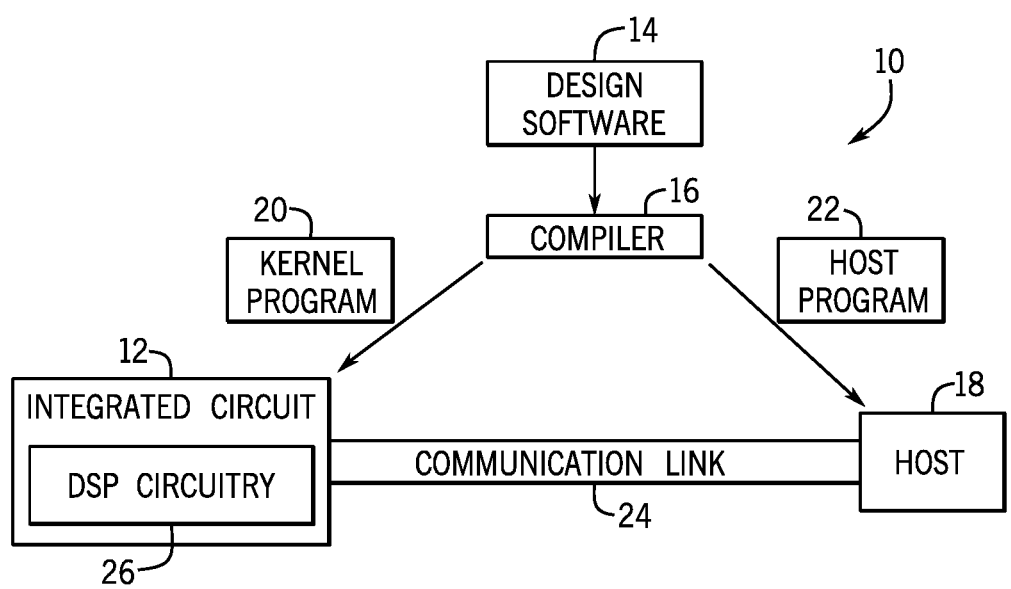
FIG. 1 is a block diagram of a system that may implement arithmetic operations using a digital signal processing (DSP) block, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. As used herein, a "Fast Fourier Transform (FFT)" operation refers to converting a signal from a time-domain signal into a corresponding frequency-domain signal. As used herein, an "inverse Fast Fourier Transform (iFFT)" operation refers to converting a signal from a frequency-domain signal into a corresponding time-domain signal.

As machine leaning and artificial intelligence applications have become ever more prevalent, there is a growing desire for circuitry to perform calculations utilized in machine-leaning and artificial intelligence applications that is also able to be used for digital signal processing applications. The present systems and techniques relate to embodiments of a digital signal processing (DSP) block that may be utilized for a variety of applications including, but not limited to, artificial intelligence (AI), digital signal processing, and cryptography. In general, a DSP block is a type of circuitry that is used in integrated circuit devices, such as field programmable gate arrays (FPGAs), to perform multiply, accumulate, and addition operations. Machine Learning (ML) technologies, machine intelligence technologies (e.g., Artificial Intelligence (AI) technologies, and high-throughput communication technologies (e.g., Fifth Generation (5G) technologies) increasingly permeate everyday life and are converging to provide ubiquitous intelligent wireless services. As communication technologies begin to provide greater throughput, higher data bandwidths, and lower latencies, a desire for gigahertz (GHz) performance in digital signal processing (DSP) circuitry of a system may increase. In addition, as technologies increasingly use relatively higher performance computations at an edge (e.g., input or output) of a system, accelerated performance of related computations may also be desired to be used within the system.

The DSP circuitry discussed herein may improve operations associated with digital signal processing within a single hardware accelerator, or the like. This DSP circuitry may perform multiple Fast Fourier Transform (FFT) and/or inverse FFT operations while reducing an amount and/or time associated with writing data onto the hardware accelerator from a host device and/or reading data from the hardware accelerator once an operation is completed. The DSP circuitry may provide a feedback structure to allow output from operations to be feed back into the DSP circuitry, thus reducing latency from data read/write operations and reducing associated power consumption.

With the foregoing in mind, FIG. 1 illustrates a block diagram of a system 10 that may perform FFT operations as described herein. A designer may desire to implement functionality or an application involving FFT operations, inverse FFT operation, or both on an integrated circuit device 12 (such as a field programmable gate array (FPGA)). The designer may specify a high-level program to be implemented, such as an OpenCL program, which may enable the designer to more efficiently and easily provide programming instructions to configure a set of programmable logic cells for the integrated circuit device 12 without requiring specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that may have to learn unfamiliar low-level hardware description languages to implement new functionalities in the integrated circuit device 12.

Designers may implement their high-level designs using design software 14. The design software 14 may use a compiler 16 to convert the high-level program into a lower-level description. The design software 14 may also be used to optimize and/or increase efficiency in the design. The compiler 16 may provide machine-readable instructions representative of the high-level program to a host 18 and the integrated circuit device 12. The host 18 may receive a host program 22, which may be implemented by kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of one or more DSP blocks 26 on the integrated circuit device 12. The DSP block 26 may include circuitry to perform, for example, FFT and inverse FFT operations. The integrated circuit device 12 may include many (e.g., hundreds or thousands) of the DSP blocks 26. Additionally, DSP blocks 26 may be communicatively coupled to another such that data outputted from one DSP block 26 may be provided to other DSP blocks 26.

While the techniques above discussion described to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
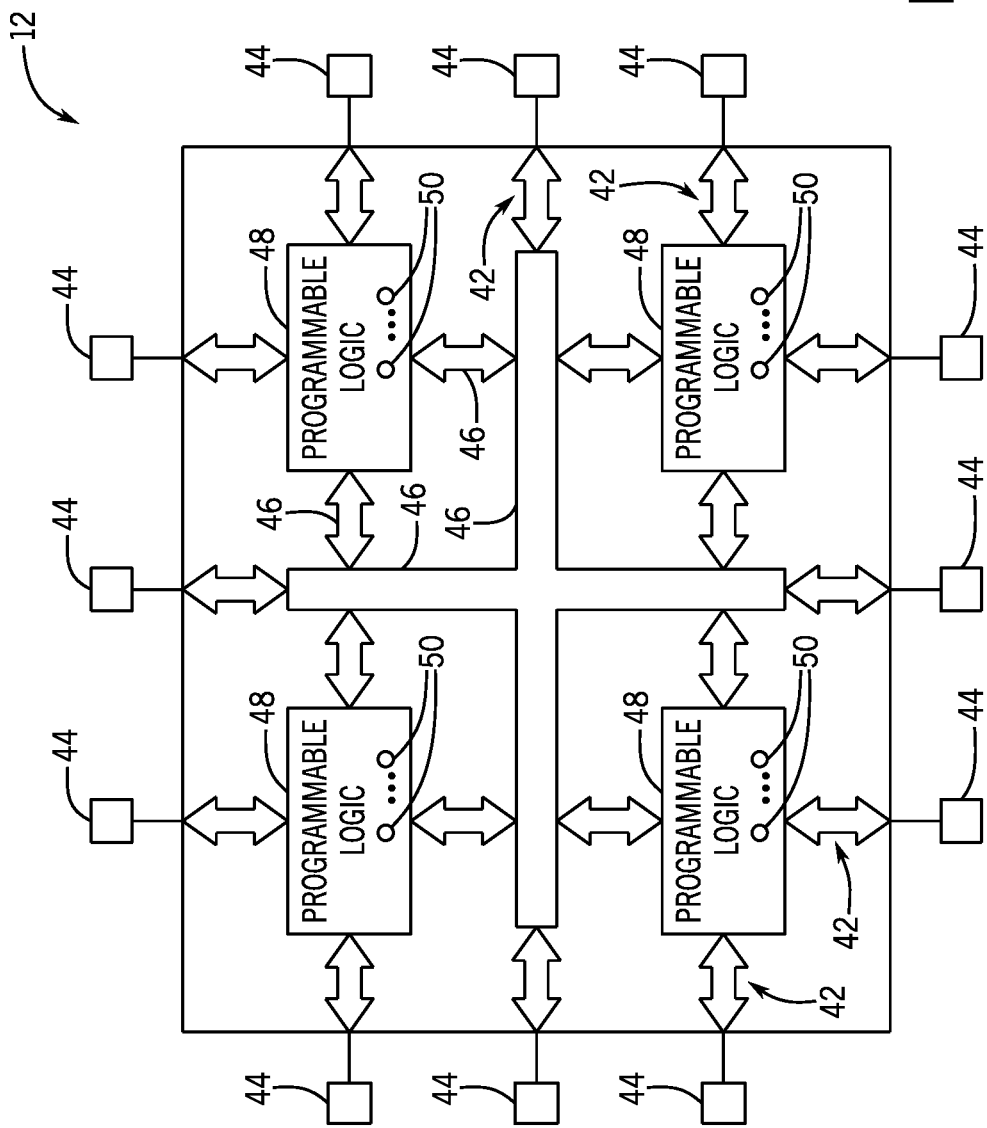
FIG. 2 is a block diagram of the integrated circuit device of FIG. 1, in accordance with an embodiment of the present disclosure.

Turning now to a more detailed discussion of the integrated circuit device 12, FIG. 2 illustrates a block diagram of the integrated circuit device 12 that may be a programmable logic device, such as an FPGA. Further, it should be understood that the integrated circuit device 12 may be any other suitable type of programmable logic device (e.g., an application-specific integrated circuit and/or application-specific standard product). Additionally or alternatively, the integrated circuit device 12 may be any suitable integrated circuit device. In certain embodiments, the integrated circuit device 12 may not be a programmable logic device. As shown, the integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configurable to perform a custom logic function. The programmable interconnects associated with interconnection resources may be considered to be a part of programmable logic 48. The programmable logic 48 may include multiple various types of programmable logic 48 of different tiers of programmability. For example, the programmable logic 48 may include various mathematical logic units, such as an arithmetic logic unit (ALU) or configurable logic block (CLB) that may be configurable to perform various mathematical functions (e.g., FFT, inverse FFT, multiplication, addition, and so forth). Integrated circuits, such as integrated circuit device 12, may contain programmable elements 50 within the programmable logic 48. For example, a designer (e.g., a customer) may program (e.g., configure) the programmable logic 48 to perform one or more desired functions (e.g., FFT operations).

Figure 3:
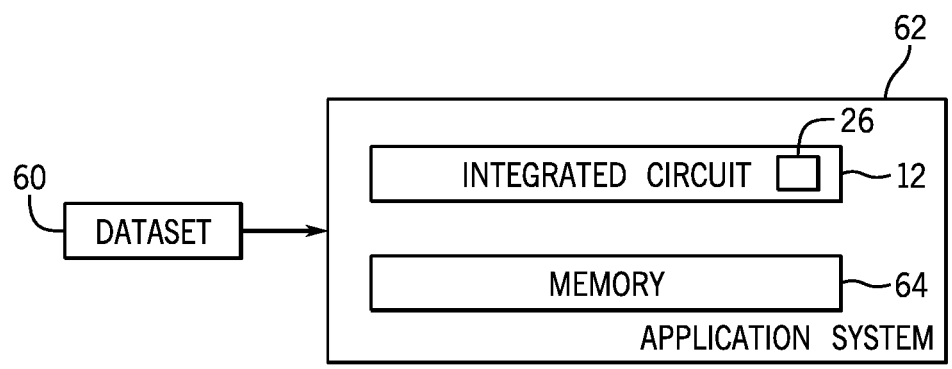
FIG. 3 is a block diagram of an application system that includes the integrated circuit of FIG. 1 and a memory, in accordance with an embodiment.

Once programmed, the integrated circuit 12 may process a dataset 60, as is shown in FIG. 3. FIG. 3 is a block diagram of an application system 62 that includes the integrated circuit 12 and memory 64. The application system 62 may represent a device that uses the integrated circuit 12 to perform operations based on computational results from the integrated circuit 12, or the like. The integrated circuit 12 may directly receive the dataset 60. The dataset 60 may be stored into the memory 64 before, during, or concurrent to transmission to the integrated circuit 12.

As bandwidths and processing expectations increase, such as in response to the advent of fifth generation (5G) and higher communication techniques to perform computations, the integrated circuit 12 may be expected to handle subsequent increases in size of the dataset 60 over time. Additionally or alternatively, the integrated circuit 12 may also be expected to perform digital signal processing operations of signals transmitted using 5G or higher techniques (e.g., signals of higher throughput and/or high data transmission bandwidths) and FFT operations. A single platform, such as the DSP block 26, that performs a wide variety of digital signal processing may lead to system improvements, such as acceleration of wireless signal processing operations based on FFT computations.

Figure 4:
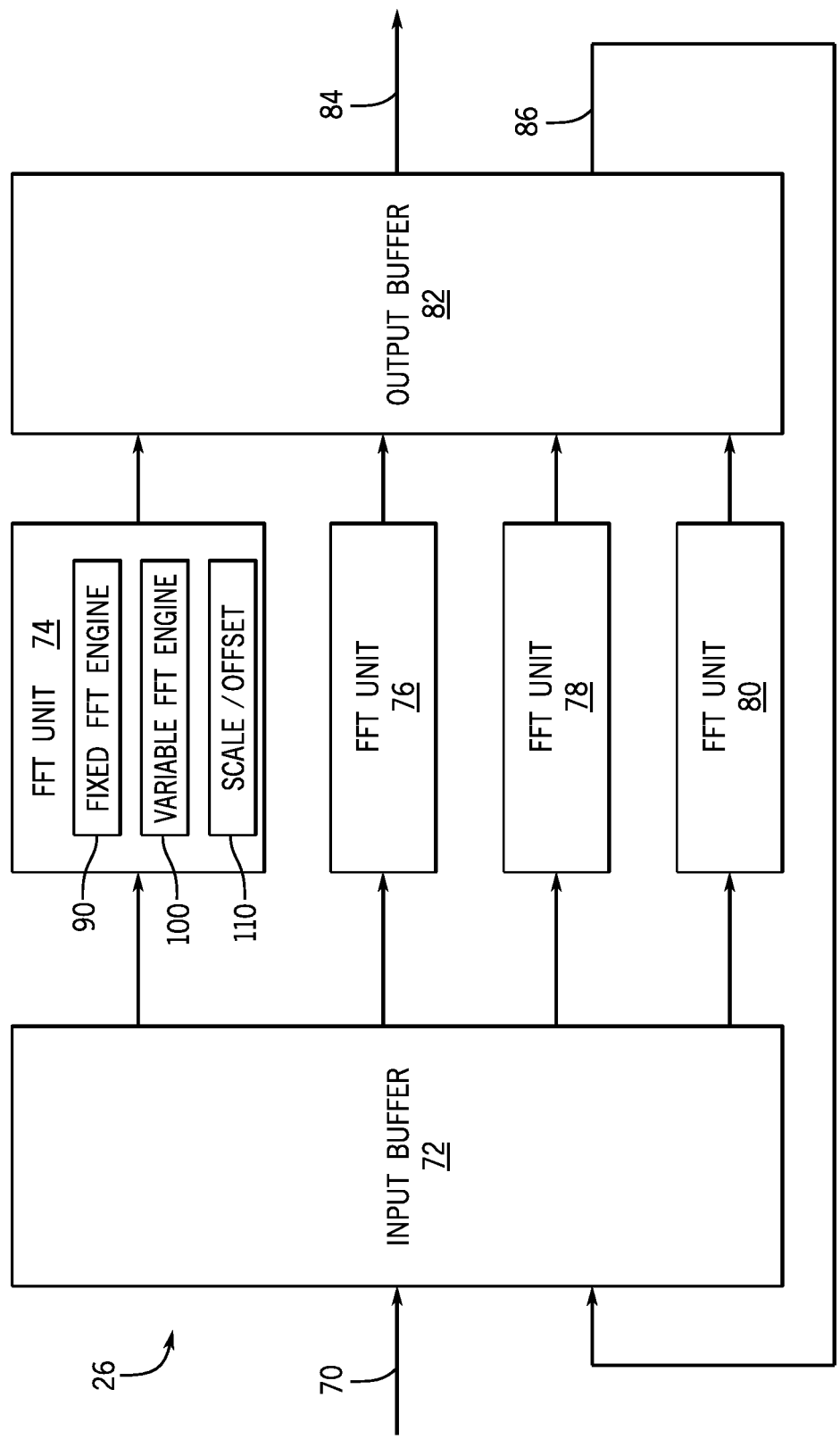
FIG. 4 is a block diagram of the digital signal processing (DSP) block of FIG. 1 including a Fast Fourier Transform (FFT) unit, in accordance with an embodiment of the present disclosure.

Keeping the foregoing in mind, FIG. 4 is a block diagram of the DSP block 26 in accordance with an embodiment of the present disclosure. The DSP block 26 may be used for a variety of applications and to perform many different operations associated with the applications, such as FFT, inverse FFT, multiplication, addition operations, and so forth. As illustrated, the DSP block 26 includes an input 70 (e.g., dataset 60), an input buffer 72, FFT unites 74, 76, 78, 80, an output buffer 82, an output 84, and a feedback loop 86.

The DSP block 26 may receive inputs from routing fabric at the input 70. The received inputs may include any number of data values (e.g., 2, 4, 8, 16, 1024, 2048, 4096, and so forth) for performing FFT operations. As data (e.g., values)

is received, the data may be stored in the input buffer 72. In certain embodiments, the input buffer 72 may provide a number of data samples equivalent to the total number of inputs of the FFT units 74, 76, 78, 80. In some embodiments, the input buffer 72 may include an address reversal component capable of reordering data from the input 70 between a natural order and a bit reversed order. Additionally or alternatively, the input buffer 72 may generate data values (e.g., zeroes) for missing data samples. The FFT units 74, 76, 78, 80 are located downstream of the input buffer 72 and each FFT unit may receive one or more values (e.g., output) from the input buffer 72 (or, in some embodiments, directly from the input 70). The input buffer 72 may route the received data to the various FFT units located downstream of the input buffer 72. The FFT units 74, 76, 78, 80 may output values to the output buffer 82. In some embodiments, the output buffer 82 may include an address reversal component capable of reordering data from the FFT units between the natural order and the bit reversed order. In certain embodiments, the output buffer 82 may include a sequencer component to allow data stored in the output buffer 82 to be read out one or more times.

In certain embodiments, the output buffer 82 may store output values from the FFT units 74, 76, 78, 80 and may route any number of the output values as the output 84 and/or may route any number of the output values in the feedback loop 86 back to the input buffer 72. As such, the input buffer 72 may receive the values from the feedback loop 86 and may store and/or route the values to any of the FFT units 74, 76, 78, 80 for additional operations. Accordingly, the DSP block 26 may perform any number of FFT and/or inverse FFT operations without reading data out of the hardware accelerator (e.g., integrated circuit 12) and/or without writing data back to the hardware accelerator for each FFT operation. Each FFT unit may perform FFT operations and/or inverse FFT operations. For example, each FFT unit may convert an input signal from a time-domain to a frequency-domain and/or may convert an input signal from a frequency-domain to a time-domain.

The DSP block 26 may perform frequency domain filtering by filtering a data stream (e.g., the input 70) from the time-domain into the frequency-domain using a first FFT unit (e.g., the fixed FFT engine 90 and/or the variable FFT engine 100). The scale/offset block 110 may multiply frequency-domain data stream with filter coefficients stored in a lookup table. The output of the scale/offset block 110 may then be routed from the output buffer 82 to the input buffer 72 by the feedback loop 86 for conversion from the frequency-domain into the time-domain by a second FFT unit. Additionally or alternatively, the DSP block 26 may perform FFT operations that exceed the size of a single FFT unit by feeding the output of the FFT unit back into the input buffer 72 for further FFT computations by a subsequent FFT unit. In certain embodiments, the DSP block 26 may perform a crest factor reduction operation by converting a data stream (e.g., the input 70) from the time-domain into the frequency-domain using a first FFT unit (e.g., the fixed FFT engine 90 and/or the variable FFT engine 100). The scale/offset block 110 may multiply desired frequencies with 1 values and unwanted frequencies with 0 values stored in a lookup table. The data stream may then be converted from the frequency-domain into the time-domain using an FFT operation in a second FFT unit.

As illustrated, the FFT unit 74 may include a fixed FFT engine 90, a variable FFT engine 100, and a scale/offset block 110. It should be noted that each FFT unit 74, 76, 78, 80 may include a corresponding fixed FFT engine 90, a corresponding variable FFT engine 100, and a corresponding scale/offset block 110. The fixed FFT engine 90 may receive any number of input values (e.g., 2, 4, 8, 1024, 2048, 4096, and so forth) from the input buffer 72 and may include a corresponding number of inputs, $N_{fixed}$, based on the received number of input values. In some embodiments, the fixed FFT engine 90 may include any number of stages, $K_{fixed}$, based on the number of inputs, $N_{fixed}$. For example, the number of stages of the fixed FFT engine 90 may be the binary logarithm of the number of inputs, Mixed. As such, if the fixed FFT engine 90 has 8 inputs, the fixed FFT engine 90 includes 3 stages. The fixed FFT engine 90 may have a fixed size corresponding to the number of input values received. For example, the size of the fixed FFT engine 90 may be selected according to a desired minimum size.

The variable FFT engine 100 may receive any number of input values (e.g., 2, 4, 8, 1024, 2048, 4096, and so forth) from the input buffer 72 and may include a corresponding number of inputs, $N_{variable}$, based on the received number of input values. In certain embodiments, the variable FFT engine 100 may include a variable number of stages, $K_{variable}$, based on the number of inputs, $N_{variable}$. For example, the maximum number of stages of the variable FFT engine 100 may be the binary logarithm of the number of inputs, $N_{variable}$, and the minimum number of stages may be zero (e.g., all bypass stages). Accordingly, the variable FFT engine 100 may have a variable size and may include any number of bypass stages such that input values may be bypassed to a subsequent stage. For example, the input values may be modified by multiplying by either 0 or 1. In some embodiments, the fixed FFT engine 90 and the variable FFT engine 100 may include the same number of inputs (e.g., 2, 4, 8, 16, 1024, 2048, 4096, and so forth). The combination of the fixed FFT engine 90 and the variable FFT engine 100 may allow an FFT operation of size 2 to the power of ($K_{fixed}+K_{variable}$), where $K_{variable}$ can be any number from zero up to and including $K_{fixed}$.

The scale/offset block 110 may perform multiplication and/or addition operations (e.g., windowing, frequency domain filtering, frequency masking, scaling, frequency shifting, and so forth) to any number of input values (e.g., 2, 4, 8, 16, 1024, 2048, 4096, and so forth). For example, the scale/offset block 110 may perform addition operations to frequency shift the input values and/or may multiply the input values by corresponding constants to scale the input values. In certain embodiments, the fixed FFT engine 90, the variable FFT engine 100, and the scale/offset block 110 may be connected (e.g., communicatively coupled) in series. For example, an output of the fixed FFT engine 90 may be connected to an input of the variable FFT engine 100 and an output of the variable FFT engine 100 may be connected to an input of the scale/offset block 110.

Figure 5:
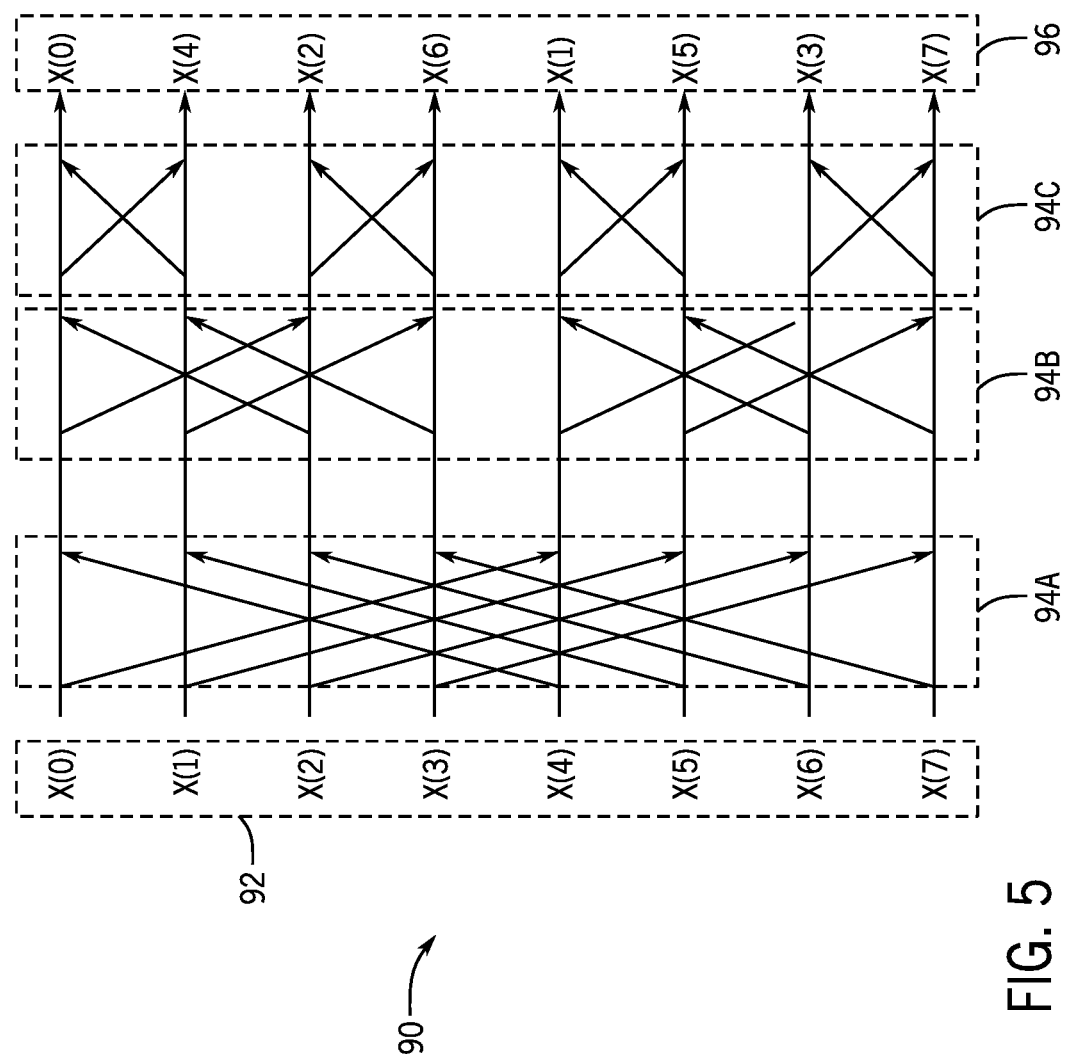
FIG. 5 is a block diagram of a fixed FFT engine within the FFT unit of FIG. 4, in accordance with an embodiment of the present disclosure.

To facilitate further discussion of the FFT units, FIG. 5 illustrates the fixed FFT engine 90. The fixed FFT engine 90 may receive inputs 92 and may include any number of stages, such as stages 94A, 94B, 94C. The fixed FFT engine 90 may convert a signal associated with the inputs 92 from a time-domain to a frequency-domain. The number of stages of the fixed FFT engine 90 corresponds to the number of received inputs 92. For example, the number of stages may be a logarithm (e.g., base 2, base 4, and so forth) of the number of received inputs 92. As illustrated, the fixed FFT engine 90 includes 8 inputs. Accordingly, the fixed FFT engine 90 includes 3 stages 94A, 94B, 94C. The fixed FFT engine 90 may implement an FFT operation and/or an inverse FFT operation on the inputs 92 to generate outputs 96. For example, the fixed FFT engine 90 may convert the inputs 92 from a time-domain to a frequency-domain for the outputs 96. The size of the fixed FFT engine 90 is equivalent to the number of frequency bins (e.g., number of data values) for the FFT operation. The fixed FFT engine 90 may be a fixed size based on the number of inputs (e.g., 8 inputs, 16 inputs, 1024 inputs, 2048 inputs, 4096 inputs, and so forth).

Figure 6:
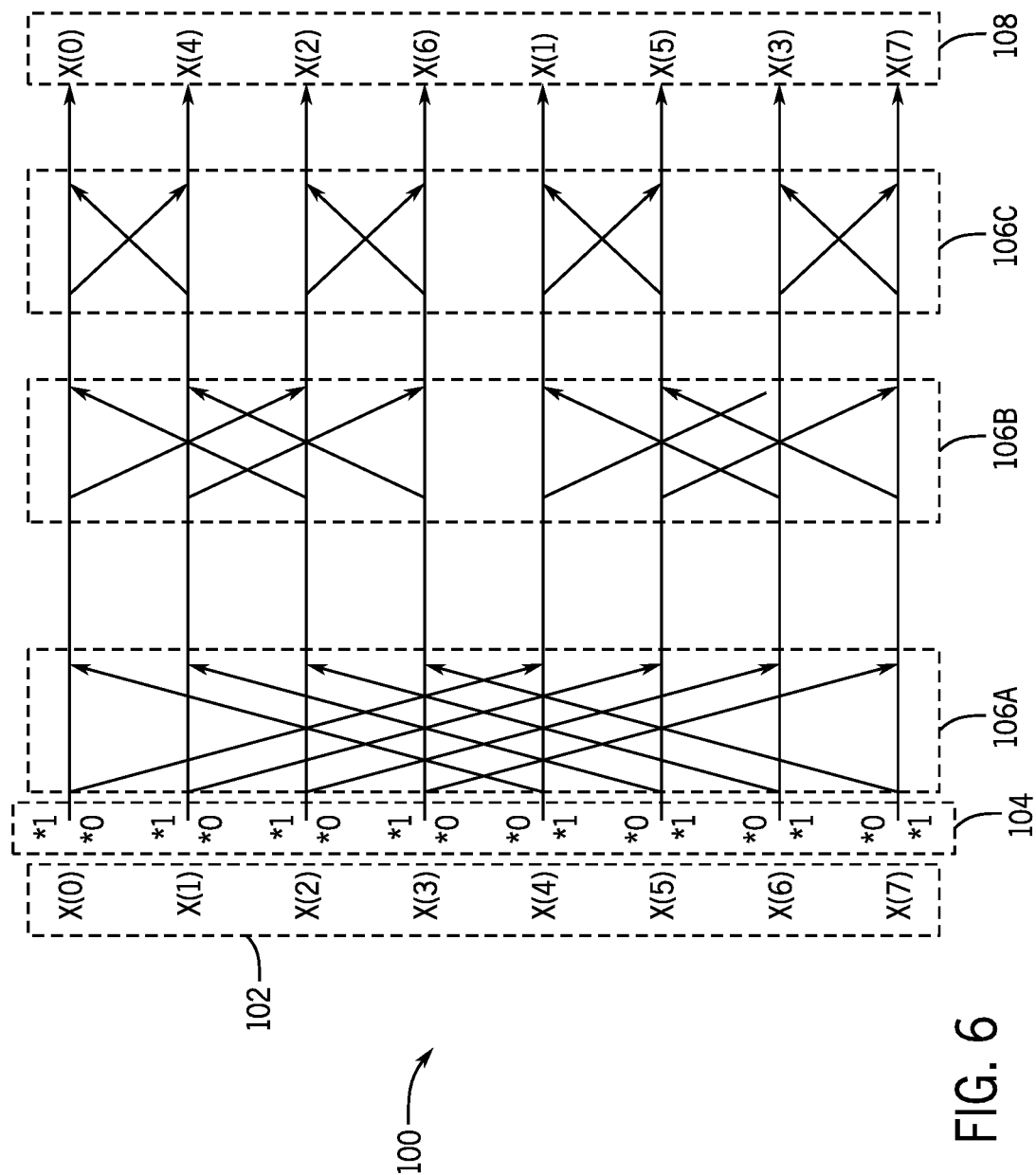
FIG. 6 is a block diagram of a variable FFT engine within the FFT unit of FIG. 4, in accordance with an embodiment of the present disclosure.

To facilitate further discussion of the FFT units, FIG. 6 illustrates the variable FFT engine 100. The variable FFT engine 100 may receive inputs 102 and may include any number of bypass stages, such as bypass stage 104, and any number of computation stages, such as computation stages 106A, 106B, 106C. The variable FFT engine 100 may convert a signal associated with the inputs 102 from a time-domain to a frequency-domain. The number of stages of the variable FFT engine 100 may vary and may be as many as the number of stages of the fixed FFT engine 90. The variable FFT engine 100 may implement an FFT operation and/or an inverse FFT operation on the inputs 102 to generate outputs 108. For example, the variable FFT engine 100 may convert the inputs 102 from a time-domain to a frequency-domain for the outputs 108. The size of the variable FFT engine 100 may depend on the number of bypass stages, such as bypass stage 104. The bypass stage 104 may allow data values of the FFT operation to bypass any of the computation stages. In certain embodiments, the bypass stage 104 may modify the data values by multiplication either by 1 or 0. For example, multiplying one of the data values by zero leaves the data value mathematically unchanged and continues to a subsequent stage (e.g., a subsequent bypass stage, a subsequent computation stage). As another example, the bypass stage 104 may multiply the data value by zero to reduce the number of inputs to the variable FFT engine 100. As such, the bypass stage 104 may adjust the size of the variable FFT engine 100 based on the received inputs 102 and the number of computation stages. In certain embodiments, any of the computation stages 106A, 106B, 106C may include a bypass (e.g., multiplication by 1 or 0).

Figure 7:
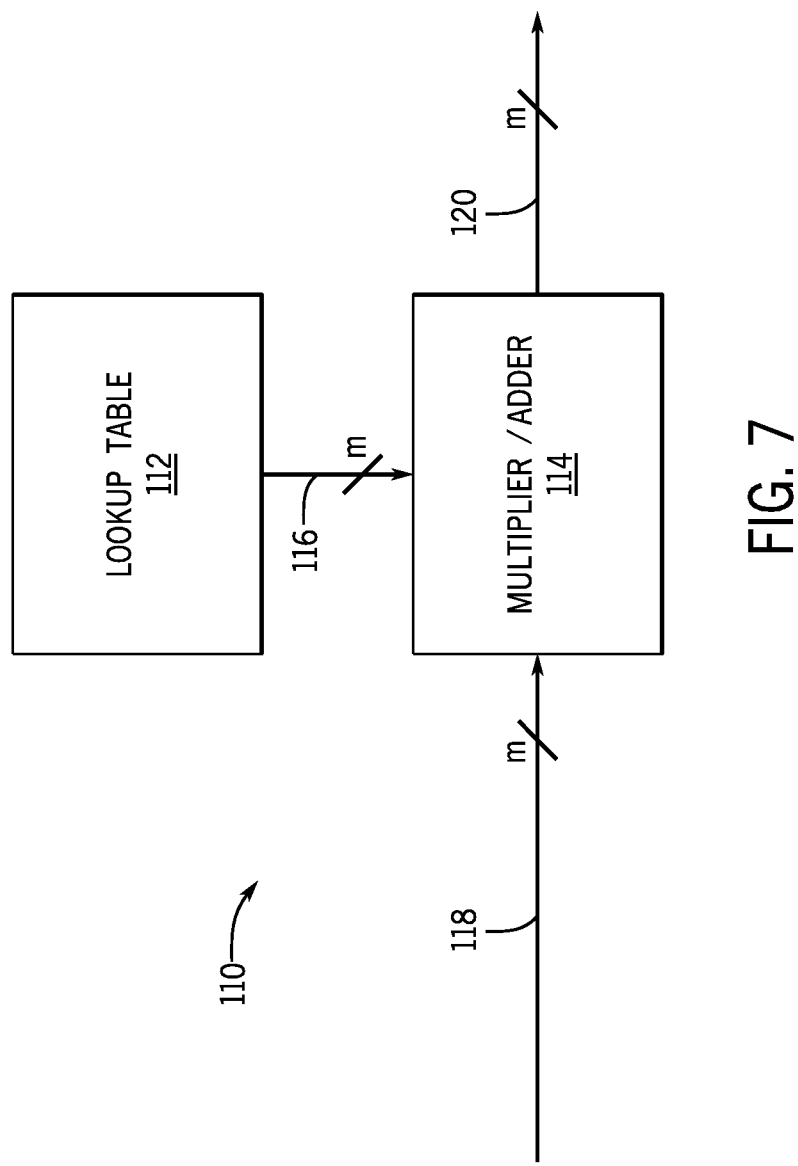
FIG. 7 is a block diagram of a scale/offset block within the FFT unit of FIG. 4, in accordance with an embodiment of the present disclosure.

To facilitate further discussion of the FFT units, FIG. 7 illustrates the scale/offset block 110. The scale/offset block 110 may include a lookup table 112 and a multiplier/adder block 114. The lookup table 112 may store any number of values and the lookup table 112 may generate the output 116 to provide the values to the multiplier/adder block 114. The multiplier/adder block 114 may receive the values from the lookup table 112 and an input 118. In certain embodiments, the input 118 may include any number of data values (e.g., 8 values, 16 values, 1024 values, 2048 values, 4096 values, and so forth) and may multiply the data values by the received values from the output 116 of the lookup table 112. The multiplier/adder block 114 may receive a corresponding number of values from the lookup table 112 based on the number of data values received in the input 118. For example, the multiplier/adder block 114 may receive an equivalent number of values from the lookup table 112 to the number of data values received in the input 118. The multiplier/adder block 114 may multiply the data values by corresponding values from the lookup table 112 to scale the data values. Additionally or alternatively, the multiplier/adder block 114 may sum the data values and corresponding values from the lookup able 112 to offset the data values by an amount. The multiplier/adder block 114 may generate the output 120 including the scaled and/or offset data values.

Figure 8:
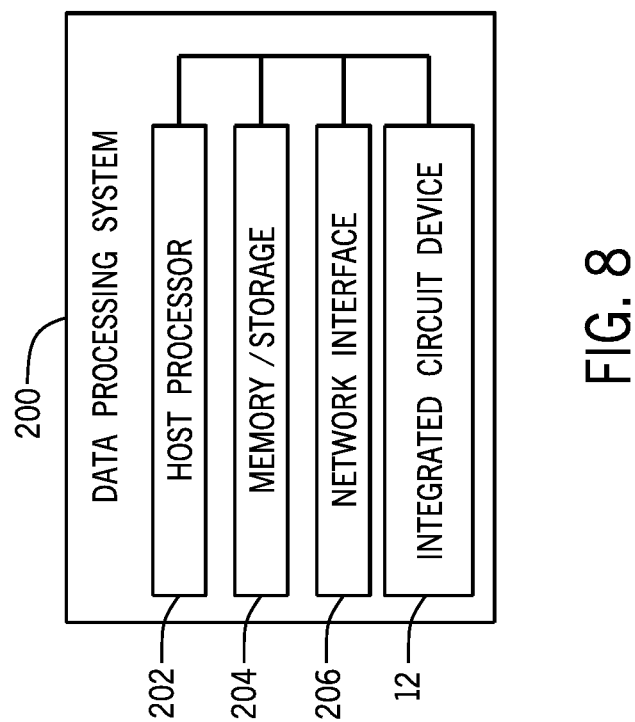
FIG. 8 is a block diagram of a data processing system where one or more DSP blocks may be implemented, in accordance with an embodiment.

The integrated circuit device 12 may be, or may be a component of, a data processing system, such as the data processing system 200, shown in FIG. 8. The data processing system 200 may include a host processor 202, memory and/or storage circuitry 204, and a network interface 206. The data processing system 200 may include more or fewer components (e.g., electronic display, user interface structures, or ASICs). The host processor 202 may include any suitable processor, such as an INTEL® Xeon® processor or a reduced-instruction processor (e.g., a reduced instruction set computer (RISC), or an Advanced RISC Machine (ARM) processor) that may manage a data processing request for the data processing system 200 (e.g., to perform machine learning, video processing, voice recognition, image recognition, data compression, database search ranking, bioinformatics, network security pattern identification, spatial navigation, or the like). The memory and/or storage circuitry 204 may include random access memory (RAM), read-only memory (ROM), one or more hard drives, flash memory, or the like. The memory and/or storage circuitry 204 may hold data to be processed by the data processing system 200. In some cases, the memory and/or storage circuitry 204 may also store configuration programs (bitstreams) for programming the integrated circuit device 12. The network interface 206 may allow the data processing system 200 to communicate with other electronic devices. The data processing system 200 may include several different packages or may be contained within a single package on a single package substrate.

In one example, the data processing system 200 may be part of a data center that processes a variety of different requests. For instance, the data processing system 200 may receive a data processing request via the network interface 206 to perform digital signal processing, machine learning, video processing, voice recognition, image recognition, data compression, database search ranking, bioinformatics, network security pattern identification, spatial navigation, or some other specialized task. The host processor 202 may cause the programmable logic fabric of the integrated circuit device 12 to be programmed with a multiplier suitable to implement a requested task. For instance, the host processor 202 may instruct that a configuration data (bitstream) stored on the memory and/or storage circuitry 204 to be programmed into the programmable logic fabric of the integrated circuit device 12. The configuration data (bitstream) may represent a circuit design set to use one or more Fast Fourier Transform arithmetic operations that may be mapped to and packed together in the programmable logic according to the techniques described herein. By efficiently mapping and packing the Fast Fourier Transform operations, the area, latency, and/or routing resources used to perform the requested task may be reduced on the integrated circuit device 12.

Accordingly, the techniques discussed herein may enable FFT and inverse FFT operations to be performed using a single DSP block. More specifically, as discussed above, the DSP block may be utilized to perform multiple FFT and/or inverse FFT operations by providing a feedback loop for the output of the operations. Accordingly, the DSP block may perform multiple FFT and/or inverse FFT operations without reading data (e.g., output of a previous operation) out of the integrated circuit or writing data into the integrated circuit for a subsequent operation.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS OF THE DISCLOSURE

The following numbered clauses define certain example embodiments of the present disclosure.

Clause 1.
A digital signal processing (DSP) block comprising:
a Fast Fourier Transform (FFT) unit configured to perform an FFT operation, the FFT unit comprising:
a first FFT engine configured to convert a signal between a time-domain and a frequency-domain, wherein the first FFT engine is a fixed size FFT engine; and
a second FFT engine communicatively coupled to the first FFT engine, wherein the second FFT engine is a variable size FFT engine.

Clause 2.
The DSP block of clause 1, the FFT unit comprising a scale/offset block configured to perform a multiplication operation, an addition operation, or a combination thereof, wherein the scale/offset block is communicatively coupled to at least one of the first FFT engine, the second FFT engine, or a combination thereof.

Clause 3.
The DSP block of clause 1, comprising an input buffer configured to receive a dataset and configured to route the dataset to the FFT unit.

Clause 4.
The DSP block of clause 3, comprising an output buffer configured to receive an output of the FFT unit.

Clause 5.
The DSP block of clause 4, comprising a feedback loop configured to route the output to the input buffer.

Clause 6.
The DSP block of clause 5, comprising a second FFT unit, wherein the second FFT unit is configured to receive the output from the FFT unit.

Clause 7.
The DSP block of clause 6, the second FFT unit comprising:
a third FFT engine configured to convert a signal associated with the output between the time-domain and the frequency-domain, wherein the third FFT engine is a fixed size FFT engine; and
a fourth FFT engine communicatively coupled to the third FFT engine, wherein the fourth FFT engine is a variable size FFT engine.

Clause 8.
The DSP block of clause 7, the second FFT unit comprising a second scale/offset block configured to perform a multiplication operation, an addition operation, or a combination thereof on an output of the fourth FFT engine.

Clause 9.
The DSP block of clause 1, wherein the DSP block is included within a field-programmable gate array (FPGA).

Clause 10.
An integrated circuit device comprising a digital signal processing (DSP) block, wherein the DSP block comprises:
a plurality of Fast Fourier Transform (FFT) units configured to perform an FFT operation, each FFT unit comprising:
a first FFT engine configured to convert a signal between a time-domain and a frequency-domain, wherein the first FFT engine is a fixed size FFT engine; and
a second FFT engine communicatively coupled to the first FFT engine, wherein the second FFT engine is a variable size FFT engine; and
a feedback loop configured to provide an output of a first FFT unit of the plurality of FFT units to an input of a second FFT unit of the plurality of FFT units.

Clause 11.
The integrated circuit device of clause 10, each FFT unit comprising a scale/offset block configured to perform a multiplication operation, an addition operation, or a combination thereof.

Clause 12.
The integrated circuit device of clause 11, the scale/offset block comprising a lookup table configured to store values and a multiplier/adder block configured to perform the multiplication operation, the addition operation, or the combination thereof.

Clause 13.
The integrated circuit device of clause 10, the DSP block comprising an input buffer configured to receive and store an input dataset and configured to route the input dataset to one or more FFT units of the plurality of FFT units.

Clause 14.
The integrated circuit device of clause 13, the DSP block comprising an output buffer configured to receive and store an output of one or more FFT units of the plurality of FFT units.

Clause 15.
The integrated circuit device of clause 14, wherein the output buffer is configured to route the output of the one or more FFT units to the input buffer via the feedback loop.

Clause 16.
The integrated circuit device of clause 10, wherein the second FFT engine comprises a bypass stage.

Clause 17.
The integrated circuit device of clause 16, wherein the bypass stage is configured to perform a multiplication operation.

Clause 18.
A system comprising: an integrated circuit device; and
a programmable logic device communicatively coupled to the integrated circuit device, wherein the programmable logic device comprises a digital signal processing (DSP) block that comprises:
a Fast Fourier Transform (FFT) unit configured to perform an FFT operation, the FFT unit comprising:
a first FFT engine configured to convert a signal between a time-domain and a frequency-domain, wherein the first FFT engine is a fixed size FFT engine;
a second FFT engine communicatively coupled to the first FFT engine, wherein the second FFT engine is a variable size FFT engine; and
a scale/offset block communicatively coupled to the second FFT engine, the scale/offset block configured to perform a multiplication operation, an addition operation, or a combination thereof on an output of the second FFT engine.

Clause 19.

The system of clause 18, comprising a substrate, wherein the integrated circuit device and the programmable logic device are mounted on the substrate.

Clause 20.

The system of clause 19, wherein the programmable logic device comprises a field-programmable gate array (FPGA).

What is claimed is:

1. A digital signal processing (DSP) block comprising:
 a Fast Fourier Transform (FFT) unit configured to perform an FFT operation, the FFT unit comprising:
  a first FFT engine configured to convert a signal between a time-domain and a frequency-domain, wherein the first FFT engine is a fixed size FFT engine; and
  a second FFT engine communicatively coupled to the first FFT engine, wherein the second FFT engine is a variable size FFT engine.

2. The DSP block of claim 1, the FFT unit comprising a scale/offset block configured to perform a multiplication operation, an addition operation, or a combination thereof, wherein the scale/offset block is communicatively coupled to at least one of the first FFT engine, the second FFT engine, or a combination thereof.

3. The DSP block of claim 1, comprising an input buffer configured to receive a dataset and configured to route the dataset to the FFT unit.

4. The DSP block of claim 3, comprising an output buffer configured to receive an output of the FFT unit.

5. The DSP block of claim 4, comprising a feedback loop configured to route the output to the input buffer.

6. The DSP block of claim 5, comprising a second FFT unit, wherein the second FFT unit is configured to receive the output from the FFT unit.

7. The DSP block of claim 6, the second FFT unit comprising:
 a third FFT engine configured to convert a signal associated with the output between the time-domain and the frequency-domain, wherein the third FFT engine is a fixed size FFT engine; and
 a fourth FFT engine communicatively coupled to the third FFT engine, wherein the fourth FFT engine is a variable size FFT engine.

8. The DSP block of claim 7, the second FFT unit comprising a second scale/offset block configured to perform a multiplication operation, an addition operation, or a combination thereof on an output of the fourth FFT engine.

9. The DSP block of claim 1, wherein the DSP block is included within a field-programmable gate array (FPGA).

10. An integrated circuit device comprising a digital signal processing (DSP) block, wherein the DSP block comprises:
 a plurality of Fast Fourier Transform (FFT) units configured to perform an FFT operation, each FFT unit comprising:
  a first FFT engine configured to convert a signal between a time-domain and a frequency-domain, wherein the first FFT engine is a fixed size FFT engine; and
  a second FFT engine communicatively coupled to the first FFT engine, wherein the second FFT engine is a variable size FFT engine; and
 a feedback loop configured to provide an output of a first FFT unit of the plurality of FFT units to an input of a second FFT unit of the plurality of FFT units.

11. The integrated circuit device of claim 10, each FFT unit comprising a scale/offset block configured to perform a multiplication operation, an addition operation, or a combination thereof.

12. The integrated circuit device of claim 11, the scale/offset block comprising a lookup table configured to store values and a multiplier/adder block configured to perform the multiplication operation, the addition operation, or the combination thereof.

13. The integrated circuit device of claim 10, the DSP block comprising an input buffer configured to receive and store an input dataset and configured to route the input dataset to one or more FFT units of the plurality of FFT units.

14. The integrated circuit device of claim 13, the DSP block comprising an output buffer configured to receive and store an output of one or more FFT units of the plurality of FFT units.

15. The integrated circuit device of claim 14, wherein the output buffer is configured to route the output of the one or more FFT units to the input buffer via the feedback loop.

16. The integrated circuit device of claim 10, wherein the second FFT engine comprises a bypass stage.

17. The integrated circuit device of claim 16, wherein the bypass stage is configured to perform a multiplication operation.

18. A system comprising:
 an integrated circuit device; and
 a programmable logic device communicatively coupled to the integrated circuit device, wherein the programmable logic device comprises a digital signal processing (DSP) block that comprises:
  a Fast Fourier Transform (FFT) unit configured to perform an FFT operation, the FFT unit comprising:
   a first FFT engine configured to convert a signal between a time-domain and a frequency-domain, wherein the first FFT engine is a fixed size FFT engine;
   a second FFT engine communicatively coupled to the first FFT engine, wherein the second FFT engine is a variable size FFT engine; and
   a scale/offset block communicatively coupled to the second FFT engine, the scale/offset block configured to perform a multiplication operation, an addition operation, or a combination thereof on an output of the second FFT engine.

19. The system of claim 18, comprising a substrate, wherein the integrated circuit device and the programmable logic device are mounted on the substrate.

20. The system of claim 19, wherein the programmable logic device comprises a field-programmable gate array (FPGA).

* * * * *